(12) United States Patent
Mainguet et al.

(10) Patent No.: US 9,944,432 B2
(45) Date of Patent: Apr. 17, 2018

(54) RECIPIENT FOR STORING A FLUID INTENDED TO INTERACT WITH A USER

(71) Applicant: Commissariat à l'énergie atomique et aux énergies alternatives, Paris (FR)

(72) Inventors: Jean-François Mainguet, Grenoble (FR); Gorka Arrizabalaga, Lans en Vercors (FR); Miguel Aubouy, Grenoble (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 119 days.

(21) Appl. No.: 14/435,040

(22) PCT Filed: Oct. 11, 2013

(86) PCT No.: PCT/EP2013/071351
§ 371 (c)(1),
(2) Date: Apr. 10, 2015

(87) PCT Pub. No.: WO2014/057121
PCT Pub. Date: Apr. 17, 2014

(65) Prior Publication Data
US 2015/0274364 A1 Oct. 1, 2015

(30) Foreign Application Priority Data
Oct. 12, 2012 (FR) .................................... 12 59765

(51) Int. Cl.
*B65D 23/08* (2006.01)
*A45D 33/32* (2006.01)
(Continued)

(52) U.S. Cl.
CPC ............. *B65D 23/08* (2013.01); *A45D 33/32* (2013.01); *A45D 34/00* (2013.01); *B65D 1/02* (2013.01);
(Continued)

(58) Field of Classification Search
CPC ...... G01R 27/2605; G01D 5/24; G01B 7/003; B65D 23/08; G05B 11/01
(Continued)

(56) References Cited

U.S. PATENT DOCUMENTS 3,508,445 A * 4/1970 Gagnon ................ G01P 15/132
310/90.5
4,603,581 A * 8/1986 Yamanoue ............ G01F 23/268
340/620
(Continued)

FOREIGN PATENT DOCUMENTS

EP 1792781 6/2007
FR 2967271 5/2012

*Primary Examiner* — Jermele M Hollington
*Assistant Examiner* — Christopher McAndrew
(74) *Attorney, Agent, or Firm* — Occhiuti & Rohlicek LLP

(57) ABSTRACT

A vessel for storing an object, comprising an electrically insulating container, intended to contain the object and an electrically conductive layer, arranged on a surface of the container. There is a control circuit including an electrically conductive detection element, electrically insulated from the conductive layer and capacitively coupled to the conductive layer. The control circuit is configured to measure the capacitance formed between the conductive layer and an electrically charged object brought close to the conductive layer and to generate a control signal dependent on the measured capacitance.

17 Claims, 2 Drawing Sheets

(51) Int. Cl.
*H03K 17/96* (2006.01)
*A45D 34/00* (2006.01)
*B65D 1/02* (2006.01)
*G05B 11/01* (2006.01)
*H05K 5/02* (2006.01)

(52) U.S. Cl.
CPC ........... *G05B 11/01* (2013.01); *H03K 17/962* (2013.01); *H05K 5/0247* (2013.01); *H03K 2217/96077* (2013.01)

(58) Field of Classification Search
USPC ........................................................ 324/658
See application file for complete search history.

(56) References Cited

U.S. PATENT DOCUMENTS

| | | | | |
|---|---|---|---|---|
| 5,378,991 | A * | 1/1995 | Anderson | B65D 90/508 324/450 |
| 5,563,584 | A * | 10/1996 | Rader | A61M 5/1684 128/DIG. 13 |
| 5,641,006 | A * | 6/1997 | Autrey | A47L 15/4418 137/101.19 |
| 6,452,494 | B1 | 9/2002 | Harrison | |
| 7,042,234 | B2 * | 5/2006 | Buss | G01N 27/223 324/658 |
| 7,057,516 | B2 * | 6/2006 | Donskoy | A01M 1/026 324/637 |
| 7,360,424 | B2 * | 4/2008 | Urano | G01C 9/06 73/514.06 |
| 7,622,934 | B2 * | 11/2009 | Hibbs | G01N 33/48728 204/400 |
| 8,552,316 | B2 * | 10/2013 | Granig | G01D 5/24 178/18.06 |
| 8,593,424 | B2 * | 11/2013 | Hristov | G06F 3/0416 178/18.06 |
| 8,917,096 | B2 * | 12/2014 | Afzali-Ardakani | G01N 27/221 205/792 |
| 2003/0209893 | A1 * | 11/2003 | Breed | B60J 10/00 280/735 |
| 2005/0001633 | A1 * | 1/2005 | Okushima | H03K 17/962 324/658 |
| 2005/0046428 | A1 * | 3/2005 | Tesdahl | G01R 31/046 324/658 |
| 2005/0168336 | A1 * | 8/2005 | Donskoy | A01M 1/026 340/539.11 |
| 2005/0210979 | A1 * | 9/2005 | Urano | G01C 9/06 73/514.09 |
| 2005/0217369 | A1 * | 10/2005 | Holappa | G01F 23/0015 73/304 C |
| 2009/0297075 | A1 * | 12/2009 | Muneishi | F16C 29/025 384/12 |
| 2010/0038382 | A1 | 2/2010 | Kotulla | |
| 2010/0176819 | A1 * | 7/2010 | Chambon | G01N 27/226 324/658 |
| 2011/0182458 | A1 | 7/2011 | Rosener et al. | |
| 2012/0291627 | A1 * | 11/2012 | Tom | B67D 7/0261 95/8 |
| 2012/0327016 | A1 * | 12/2012 | Hristov | G06F 3/0416 345/174 |
| 2013/0205893 | A1 * | 8/2013 | Shearer | G01F 23/00 73/290 R |
| 2013/0267005 | A1 * | 10/2013 | Kartalov | A61M 1/3496 435/183 |

* cited by examiner

US 9,944,432 B2

RECIPIENT FOR STORING A FLUID INTENDED TO INTERACT WITH A USER

RELATED APPLICATIONS

This application is a U.S. National Stage of international application number PCT/EP2013/071351, filed Oct. 11, 2013, which claims the benefit of the priority date of French Patent Application FR 12/59765, filed Oct. 12, 2012, the contents of which are herein incorporated by reference.

FIELD OF INVENTION

The invention relates to vessels, and in particular vessels intended to receive fluid and to interact with a user.

BACKGROUND

Bottles are notably used as vessels for storing consumption products, such as drinks or perfumes. For example, perfumes are most often distributed in vials provided with stoppers and making it possible to avoid the uncontrolled pouring of the stored perfume. There is a growing demand for the vial to interact with the user, by generating, for example, a light signal when the user manipulates the vial. Such vials are, for example, desired to demarcate a type of perfume from the competition.

One known vial comprises a stopper and lighting by light-emitting diode. When a switch of the stopper is manipulated, the light-emitting diode emits a light signal.

Such lighting offers relatively limited functionalities. The light intensity emitted by such a vial notably does not take into account the distance with respect to the user, because it is based only on an on or off mode. Also, such a vial generates light only when the user acts on the stopper and does not make it possible to create a differentiated lighting for the manipulation of other areas of the vial. Furthermore, such lighting reacts only to the manipulation of a switch and not to simpler gestures such as simply holding the vial.

There is currently no system suitable for detecting an action between a user and a surface of a vessel without requiring a considerable modification of the manufacturing method and without inducing a considerable cost overhead. The vessels are therefore most often inert and offer no interaction with the user in response to an action of the user.

The document EP1792781 describes a switching device for detecting the introduction of the hand of a user into a door pocket of a vehicle. The door pocket has a door interior panel wall having an opening to introduce an object into the tray. The tray is coated with a measurement electrode, connected to a device for measuring capacitance. Based on the capacitance measurement produced, a switch controls the lighting of the tray by a lamp.

The document US2005/0001633 describes a contact detection sensor insensitive to the presence of a raindrop on the sensor. For this, this sensor detects the capacitance of a user with the ground, which makes it possible to discriminate the user from a drop that is totally isolated from the ground.

SUMMARY

The invention aims to resolve one or more of these drawbacks. The invention thus relates to a vessel for storing an object, as defined in the attached claims.

Other features and advantages of the invention will emerge clearly from the description which is given thereof hereinbelow, by way of indication and in a nonlimiting manner, with reference to the attached drawings.

DETAILED DESCRIPTION

The invention proposes a vessel, including an electrically insulating container, and intended to interact with a user. For this, an electrically conductive layer is arranged on a surface of the container. The capacitance formed between the conductive layer and an object brought close and electrically charged is measured. This measurement is performed using an electrically conductive detection element capacitively coupled to the conductive layer. A control signal is generated according to the measured capacitance. This control signal can be applied to a transducer, for example a loudspeaker, a light source or an actuator.

Figure 1:
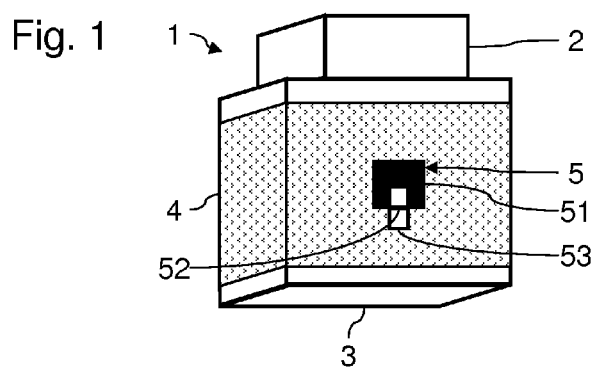
FIG. 1 is a schematic perspective view of a vial according to one embodiment of the invention.

FIG. 1 is a schematic perspective view of a vial 1 according to one embodiment of the invention. The vial 1 is intended to store an object. In the example described, the object is a powder or a cosmetic fluid 44, such as perfume or a cream. Although the examples described hereinbelow relate only to a vial, the invention obviously applies to any other vessel, such as a bottle intended to contain a drink or a case enclosing an object.

The vial 1 comprises, as is known per se, a container 3 intended to contain a fluid. The container 3 comprises a wall 31 delimiting an internal volume. The wall 31 is electrically insulating. The wall 31 can, for example, be made of glass or of plastic material. The vial 1 comprises, as is known per se, a cover 2, in this case a cabochon.

A stack of layers 4 is arranged on the outer face of the container 3. This stack of layers 4 delimits an area for detecting an electrically charged surface, in particular the hand of a user. The stack of layers 4 comprises, on the one hand, an electrically conductive layer 41 and an electrically insulating layer 42. The electrically conductive layer 41 is arranged against the outer face of the container 3. The electrically insulating layer 42 covers the conductive layer 41.

Figure 3:
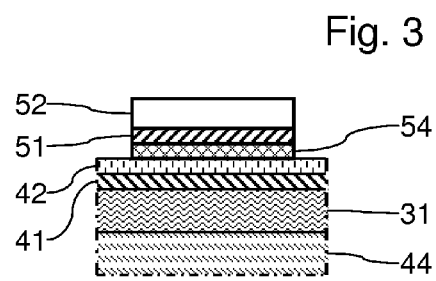
FIG. 3 is a schematic cross-sectional view of the vial at the level of a detection element.

The electrically insulating layer 42 makes it possible on the one hand to protect the conductive layer 41 from mechanical stresses. The electrically insulating layer 42 makes it possible on the other hand to form a capacitance with an electrically charged object, for example the finger 6 or the hand of a user, as illustrated in FIG. 3. When this object is sufficiently close to or placed in contact with the insulating layer 42, it forms a first electrode of a capacitance, the other electrode of the capacitance being formed by the conductive layer 41.

The vial 1 further comprises a control circuit 5. The control circuit 5 comprises, on the one hand, a detection element 51, and, on the other hand, an electronic circuit 52 electrically connected to the detection element 51. The control circuit 5 selectively generates a control signal for a transducer 53.

FIG. 3 is a schematic cross-sectional view of the vial 1 at the level of the detection element 51. The detection element 51 is electrically conductive and insulated from the conductive layer 41, here via the insulating layer 42. The detection element 51 is, here, capacitively coupled to the conductive layer 41. The detection element 51 thus forms a first electrode of a capacitance, the other electrode of the capacitance being formed by the conductive layer 41.

Figure 4:
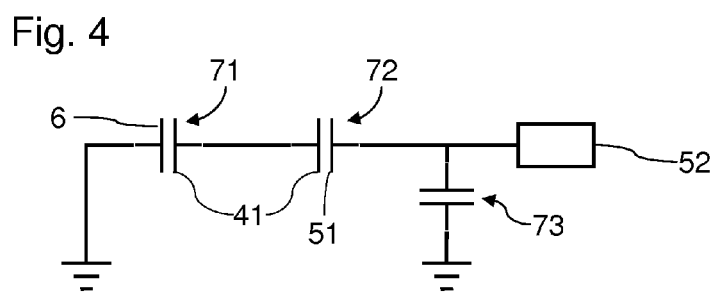
FIG. 4 is an equivalent electrical circuit diagram of the vial and of a control circuit in the presence of the finger of the user.

FIG. 4 represents an equivalent electrical circuit diagram for the vial 1 in the presence of a finger 6 on or in proximity to the insulating layer 42. The capacitance 71 corresponds to the association of the finger 6 with the conductive layer 41. The capacitance 72 corresponds to the association of the conductive layer 41 with the detection element 51. The capacitances 71 and 72 are thus connected in series. A capacitance 73 is representative of the stray capacitances of the vial 1 and of the control circuit 5.

Because of the relatively low values of the capacitances 71 and 72, a person skilled in the art would not have favored recovering the capacitance variation induced by the finger 6 via a capacitive coupling of the detection element with the control circuit 5. According to the usual solutions for detecting a finger, the recovery of the capacitance variation is in fact performed by an electrical connection between a conductive layer and an electronic circuit.

The structure illustrated is particularly appropriate for a perfume vial 1. Indeed, it is routine practice to manufacture containers 3 for such vials 1, these containers being coated with a metallic layer for decorative purposes. Because of the fineness of this metallic layer and its fragility, the latter is usually covered with a layer of varnish, which is an electrical insulator. Thus, it can be noted that a certain number of vial designs include a conductive layer on the container (metallic layer), coated with an insulating layer (layer of varnish), for decorative purposes. The layer of insulation 42 makes it possible to protect the relatively thin conductive layer 41 from the corrosive sweat of hands, from perfume leaks, and also from the oxygen of the air which causes oxidation. This structure therefore intrinsically forms a first electrode and an insulator to form a capacitance with the hand or the finger of a user. Because the conductive layer 41 covers most of the outer surface of the container 3, the first electrode formed has a very large surface area, facilitating the detection of the finger of a user (enhanced sensitivity) and potentially making it possible to obtain a capacitance 71 of a relatively high value. By positioning a detection element 51 on the varnish, the control circuit 5 can perform a capacitance variation measurement. There is therefore no need for an industrial step of locally removing the varnish or of masking the metallic layer which would require an electrical connection of the conductive layer to a control circuit.

Thus, the layer of insulation 42 serves as dielectric material to form a first capacitance 71, between the hand or the finger of the user 6, and the conductive layer 41, and to form a second capacitance 72, between said conductive layer 41 and the detection element 51.

The control circuit 5 is advantageously configured to measure the capacitance formed between the conductive layer 41 and an electrically charged object brought close to this layer 41, for example the finger or the hand of a user. The control circuit 5 is further configured to generate a control signal according to this measured capacitance, for example when the measured capacitance value crosses a threshold.

The control signal generated by the control circuit 5 is advantageously applied to the transducer 53 in order to obtain an appropriate interaction with the user. The transducer 53 will, for example, be able to be associated with a loudspeaker, a light source, or an actuator, for example a piezoelectric actuator of a diffusion pump. A transducer 53 will therefore be activated in certain circumstances, according to the wishes of the designer.

Figure 2:
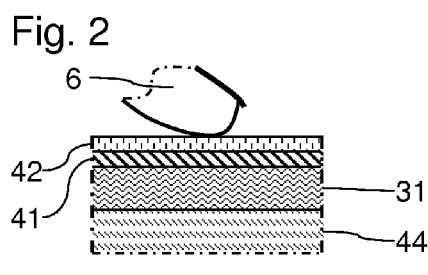
FIG. 2 is a schematic cross-sectional view of the vial showing the finger of a user, at a distance from a detection element.

The capacitance 71 can be defined by a planar capacitance of a surface of the order of magnitude of the part of the finger in contact with the varnish 42 in the example of FIG. 2. If it is assumed that this surface $S_{71}$ is of the order of 2 cm$^2$, that the layer 42 has a thickness $e_{71}$ of 25 microns (relatively thick for a protective varnish) and a relative permittivity $\in_{r71}$ of 3, the value of the capacitance 71 can be expressed by the following relationship:

$$C_{71} = \frac{\varepsilon_0 \varepsilon_{r71} S_{71}}{e_{71}}$$

This capacitance C71 then has an approximate value of 200 pF with these assumptions.

The capacitance 72 has a value C72 which can be defined by a planar capacitance of a surface corresponding to the superposition between the detection element 51 and the conductive layer 41. This surface is here defined by the surface of the detection element 51. If it is assumed that the surface $S_{72}$ is of the order of 2 cm$^2$, that the layer 42 has a thickness $e_{72}=e_{71}=25$ microns and a relative permittivity $\in_{r72}=\in_{r71}$ of 3, the value of the capacitance 72 can be expressed by the following relationship:

$$C_{72} = \frac{\varepsilon_0 \varepsilon_{r72} S_{72}}{e_{72}}$$

This capacitance C72 then has an approximate value of 200 pF with these assumptions. This capacitance C72 is advantageously substantially equivalent to a value C71 that is desired to be detected.

Thus, the capacitance C71 is seen by the control circuit 5 through the capacitance C72. Since the capacitances 71 and 72 are in series, their equivalent capacitance Ce is defined by the following relationship:

$$C_e = \frac{C_{71} * C_{72}}{C_{71} + C_{72}}$$

It can be noted that the solution proposed by the invention runs counter to the usual approach of a person skilled in the art, since the use of the capacitive coupling with the control circuit 5 adds a series capacitance which substantially lessens the signal measured by this control circuit 5.

The capacitance 73 forms a residual stray value C73, generally of the order of a few pF but which can reach several tens of pF. Thus, the ratio between C71 and C73 is here approximately equal to at least 10. Such a value makes it possible to easily detect a contact between a finger 6 and the layer of insulation 42.

It is found that the equivalent capacitance Ce exhibits an order of magnitude approximately five times greater than the value C73. Consequently, the control circuit 5 retains an input signal of sufficient amplitude to measure the capacitance C71.

Since the control circuit 5 knows approximately the capacitance values C72 and C73, it can determine the value of the capacitance C71 from the voltage measured on its input.

It is also possible to envisage detecting the hand of a user approaching the varnish 42. The hand of a user has a surface of approximately 200 cm$^2$. By bringing the hand to within approximately 1 cm of the layer of varnish 42, by once again applying the preceding C71 relationship, by considering that the permittivity of the air is predominant ($\in_{r71}$=1), the value C71 is approximately 20 pF. This capacitance is of the same order of magnitude as the stray capacitance. The detection then becomes more difficult, and the distance at which the approach of the hand is detected is reduced or occurs only on contact between the hand and the vessel.

Advantageously, use will be made of a detection element 51 with a surface at least equal to 20 mm$^2$ for a sufficient C72 value, the surface of the detection element 51 being limited by the maximum footprint accepted for this element.

In order to facilitate the detection of a contact between a finger 6 and the layer of insulation 42, this layer of insulation 42 advantageously exhibits a ratio $\in_{r71}/e_{71}$ at least equal to 100 000. In order to facilitate the detection of proximity between a finger 6 and the layer of insulation 42, this layer of insulation 42 advantageously exhibits a ratio $\in_{r71}/e_{71}$ at least equal to 500 000. It will be understood that, when the relative permittivity of the layer of insulation 42 is imposed, it is possible to act on the thickness $e_{71}$ so as to obtain the highest possible ratio $\in_{r71}/e_{71}$.

Figure 5:
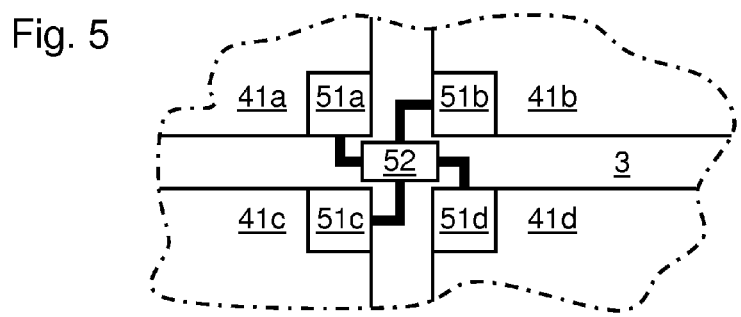
FIG. 5 schematically represents a control circuit connected to a number of independent detection elements.

FIG. 5 schematically represents a control circuit 5 provided with an electronic circuit 52 connected to a number of detection elements 51a to 51d. The detection elements 51a to 51d are electrically conductive and insulated from one another. The conductive layer 41 comprises a number of conductive parts 41a to 41d electrically insulated from one another. The detection elements 51a to 51d are capacitively coupled to the conductive parts 41a to 41d respectively. The layer of insulation 42 is thus arranged between the conductive parts 41a to 41d and the detection elements 51a to 51d. The control circuit 5 is configured to measure the capacitance formed between each of these conductive parts 41a to 41d and an electrically charged object brought close to one of these parts. The control circuit 5 is further configured to generate a control signal dependent on the different measured capacitances. Thus, the control circuit 5 is capable of generating control signals to take account of different areas of interaction between the user and the container 3.

The different conductive parts 41a to 41d can delimit different detection areas of the container 3, for example the bottom, a front wall, a rear wall or a neck. The different conductive parts 41a to 41d of the conductive layer 41 can, for example, be produced by a removal of the metallic deposit using a laser beam, a method that is known per se for shaping a decorative metallic layer for a perfume vial. In order to increase the sensitivity of the detection by the control circuit 5, the combination of the different conductive parts 41a to 41d covers at least the part of the container 3 (that is to say at least 50% of its external surface).

In this example, the detection element 51 is fixed against the layer of insulation 42 via an adhesive layer 54, advantageously a layer of conductive adhesive so as not to reduce the capacitance formed by the layer 41 and the detection element 51. It is possible to envisage positioning the control circuit 5 with its detection element 51 in an adhesive label. Although a mode of fixing by adhesion of the detection element 51 to the layer of insulation 42 has been described previously, it is also possible to envisage implementing the invention by any other mode of fixing, for example by mechanical securing.

Figure 6:
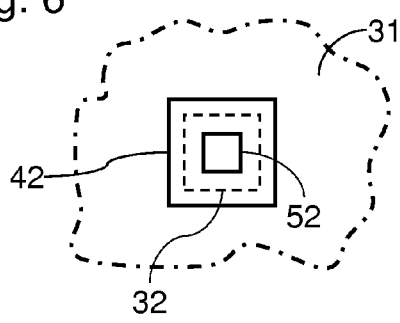
FIG. 6 is a front view of a variant of a vial at the level of a detection element.
Figure 7:
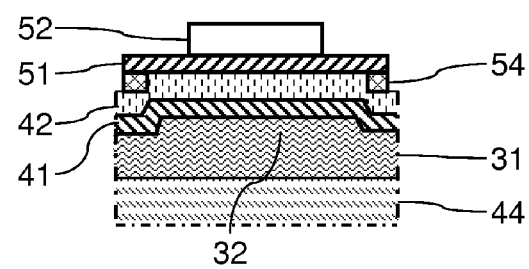
FIG. 7 is a cross-sectional view of the vial of FIG. 6 at the level of the detection element.

FIGS. 6 and 7 are respectively schematic views from the side and in transverse cross section of a variant of the invention intended to improve the quality of the measurement performed. The container 3 comprises a boss 32. The wall 31 of the container 3 is covered by the conductive layer 41 at the level of the boss 32 and therefore closely follows the form of the boss. The conductive layer 41 is covered by the layer of insulation 42 at the level of the boss 32, and therefore closely follows the form of the boss. The periphery of the boss 32 is surrounded by a bead of adhesive 54, the top face of the boss 32 not being covered by this adhesive 54. The detection element 51 is fixed to the layer of insulation 42 via this adhesive 54. Most of the detection element 51 is positioned plumb with the boss 32. Thus, the distance between the detection element 51 and the conductive layer 41 is not increased by the thickness of the layer of adhesive.

Other embodiments are possible, the boss 32 capable of being produced on the layer 41 and/or on the detection element 51, or with no particular boss by arranging for the detection element 51 to come into contact with the insulating layer 42 without the introduction of a blade of air despite the overthickness of the bead of glue, for example in a vacuum or by suitable mechanical force, for example using a means for applying a pressure, in particular a spring.

Figure 8:
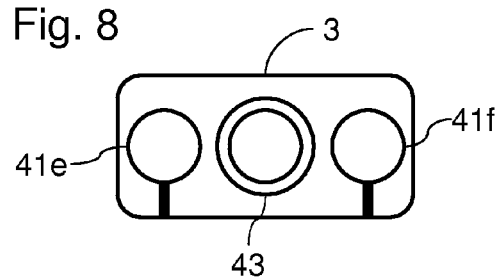
FIG. 8 is a plan view of the container of a vial according to another embodiment of the invention.
Figure 9:
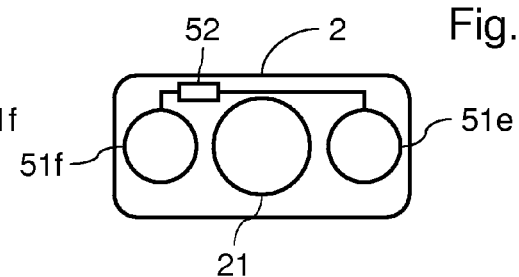
FIG. 9 is a view from below of a cabochon associated with the container of FIG. 8.

FIGS. 8 and 9 are respectively a schematic plan view of a container 3 and a schematic view from below of a cabochon 2 for a vessel 1 according to another embodiment of the invention. The container 3 comprises conductive parts covered with layer of insulation on a front face. These conductive parts are respectively connected to conductive pads 41e and 41f via conductive metal tracks. The conductive pads 41e and 41f are arranged on either side of a neck 43, in the upper part of the container 3.

The cabochon 2 comprises an orifice 21 in its median part. The cabochon 2 is intended to be mounted removably on the container 3 by sliding the neck 43 into the orifice 21. The orifice 21 is intended to house the neck 43 of the container 3. The cabochon 2 comprises detection elements 51e and 51f that are positioned facing the pads 41e and 41f, when the cabochon 2 is in the closed position, that is to say when the neck 43 is introduced into the orifice 21. The electronic circuit 52 is here advantageously formed in the cabochon 2, and electrically connected to the detection elements 51e and 51f. There are thus fewer bulk constraints on the electronic circuit 52. The interaction of the transducers 53 can also be more significant, the cabochon 2 generally having sufficient space to incorporate more complex functions such as lighting.

It is also possible to envisage producing parts of the conductive layer 41 at the level of the neck 43, instead of the pads 41e and 41f. Detection elements are then formed in the orifice 21 in order to form a capacitive coupling with the metalized part of the neck when the cabochon 2 is fitted onto the top part of the container 3.

It is, moreover, possible to envisage having the control circuit 5 incorporated in an atomizer block fitted to the top of the container 3.

It will be noted that, when the cabochon 2 is separated from the vessel, the capacitance $C_{72}$ disappears, which is easily detected by the electronic circuit 52 in a manner different from a contact where the capacitance increases. It is then possible to detect a removal of the cabochon 2 or, more generally, a moving away or a coming closer thereof relative to the container 3 and generate a control signal corresponding to this detection.

Figure 10:
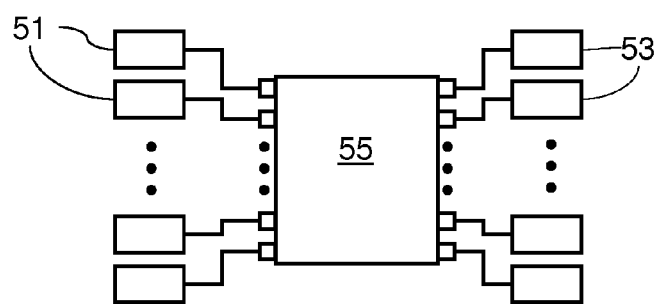
FIG. 10 schematically illustrates the connections of an example of a microcontroller of the control circuit.

The electronic circuit 52 advantageously comprises a microcontroller. In the example illustrated in FIG. 10, the microcontroller 55 comprises a number of inputs for measuring different capacitances. Thus, a number of detection elements 51 are connected to respective entries of the microcontroller 55, and superposed on respective conductive parts of the conductive layer 41. The outputs of the microcontroller 55 can be connected to respective transducers 53. The transducers 53 can be associated with respective inputs of the microcontroller 55.

A microcontroller 55 such as the model marketed under the marketing reference MSP430 by the company Texas Instruments can easily be adapted. Such a microcontroller 55 comprises a number of inputs intended to each receive a signal representative of a capacitive variation caused by the contact of the finger of a user with the layer of insulation 42 plumb with the conductive layer 41. Such a microcontroller 55 can use inputs in relaxation oscillator mode. Thus, each input considered enters into oscillation because of a phase opposition loop produced inside the microcontroller 55. The measured capacitance has an influence on an RC resonator formed with the input of the microcontroller 55, the time constant of this resonator making it possible to determine the measured capacitance value. The frequency can notably be determined by counting a number of oscillations during a predetermined period. The inputs of the microcontroller 55 can be connected by metallic conductive tracks (for example copper conductive tracks) to respective detection elements.

Advantageously, for numerous applications for products distributed on the market, the stack of layers 4 makes it possible to distinguish the fluid 44 from the outside of the container 3. For this, appropriate material and thickness choices will be made for the layers 41 and 42. It will for example be possible to envisage that the conductive layer, or the stack of the conductive layer 41 and of the layer of insulation 42, exhibit an optical transmittance at least equal to 60% over the visible spectrum.

The invention claimed is:

1. A manufacture comprising a vessel, wherein said vessel comprises a container, a control circuit, a conductive layer, a first capacitance, a second capacitance, and an insulating layer, wherein said container is an electrically-insulating container that comprises an external surface, wherein said conductive layer is an electrically-conductive layer that is arranged on said external surface of said container, wherein said insulating layer is an electrically-insulating layer that covers at least a portion of said conductive layer and thereby protects said at least a portion of said conductive layer from exposure to oxygen, wherein said control circuit comprises a first detection element that is electrically conductive, electrically insulated from said conductive layer, and capacitively coupled to said conductive layer, wherein said conductive layer and said first detection element define said first capacitance, wherein said conductive layer and an electrically-charged object define said second capacitance, said second capacitance varying with distance between said electrically-charged object and said container, said first and second capacitances being electrically in series with each other, wherein said first capacitance electrically isolates said control circuit from said conductive layer, wherein said insulating layer is arranged between said electrically conductive layer and said first detection element, and wherein said control circuit is configured to obtain a measurement of said second capacitance and to generate a control signal that depends on said measurement of said second capacitance.

2. A manufacture said manufacture comprising a vessel, said vessel comprising a container, a conductive layer, an insulating layer, a capacitance, and a control circuit, wherein said container is an electrically-insulating container that comprises an external surface, wherein said conductive layer is an electrically-conductive layer disposed on said external surface of said container, wherein said insulating layer is covered by an electrically insulating layer that covers at least a portion of said conductive layer and that protects said at least a portion of said conductive layer from oxygen, wherein said control circuit comprises a detection element that is electrically conductive, that is electrically insulated from said conductive layer, and that is capacitively coupled to said conductive layer, wherein said insulating layer is arranged between said conductive layer and said detection element, wherein said conductive layer and said detection element form said capacitance, and wherein said control circuit is configured to generate a control signal that depends on a change in said capacitance.

3. The manufacture of claim 2, further comprising a cabochon that separates from said container and that is mounted removably on said container, wherein the control circuit is formed within said cabochon, and wherein said control circuit is configured to generate said control signal in response to movement of said cabochon towards or away from said container.

4. The manufacture of claim 1, wherein said conductive layer covers most of said container.

5. The manufacture of claim 1, wherein said conductive layer comprises a first part and a second part, said first and second parts being electrically insulated from one another, said control circuit comprising a second detection element, said second detection element being electrically conductive, wherein said first detection element is electrically insulated from said first part and from said second part, wherein said second detecting element is electrically insulated from said first part and from said second part, wherein said first detection element is capacitively coupled to said first part, wherein said second detection element is capacitively coupled to said second part, wherein, said control circuit is configured to measure a first capacitance and a second capacitance, wherein said first capacitance is formed between said first and an electrically-charged object said first part, wherein said second capacitance is formed between said second part and said electrically-charged object, and wherein said control circuit is further configured to generate a control signal that is based at least in part on said on said measured first and second capacitances.

6. The manufacture of claim 5, wherein said combination of said parts covers most of the container.

7. The manufacture of claim 1, wherein said insulating layer exhibits a ratio $\in_r/e$ greater than 100,000, with $\in_r$ being the relative permittivity of the material of the insulating layer and e being the thickness of the insulating layer.

8. The manufacture of claim 7, in which said insulating layer exhibits a ratio $\in_r/e$ greater than 500,000, with $\in_r$ being the relative permittivity of the material of the insulating layer and e being the thickness of the insulating layer.

9. The manufacture of claim 1, wherein said first detection element is glued onto the insulating layer via a conductive adhesive.

10. The manufacture of claim 1, wherein said first detection element is a conductive surface with a surface area at least equal to 20 mm$^2$ arranged facing said conductive layer.

11. The manufacture of claim 1, further comprising a cabochon that is configured to be secured removably to the container, wherein when said cabochon is secured to said container, said cabochon covers said container, and when said cabochon is removed from said container, said container is open, wherein said control circuit is fixed to said cabochon, wherein, when said cabochon covers said container, said first detection element faces said conductive layer and is capacitively coupled to said conductive layer.

12. The manufacture of claim 1, wherein said circuit comprises a microcontroller of which at least one input terminal is electrically connected to said first detection element.

13. The manufacture of claim 1, further comprising cosmetic product, wherein said cosmetic product is disposed in said container.

14. The manufacture of claim 1, wherein said conductive layer has an optical transmittance that is at least equal to 60% over the visible spectrum.

15. The manufacture of claim 1, further comprising a transducer that is configured to receive the generated control signal.

16. The manufacture of claim 1, further comprising perfume, wherein said perfume is disposed in said container.

17. The manufacture of claim 1, further comprising cream, wherein said cream is disposed in said container.

* * * * *